(12) United States Patent
Yokobatake et al.

(10) Patent No.: US 7,172,439 B1
(45) Date of Patent: Feb. 6, 2007

(54) DVD INTEGRATED CRT TELEVISION AND CONNECTOR FIXING STRUCTURE

(75) Inventors: Masayuki Yokobatake, Osaka (JP); Hiroyuki Arai, Osaka (JP); Yuzen Chin, Osaka (JP); Shigeru Yokota, Osaka (JP); Yoshikazu Kawai, Osaka (JP)

(73) Assignee: Funai Electric Co., Ltd., Daito (JP)

( * ) Notice: Subject to any disclaimer, the term of this patent is extended or adjusted under 35 U.S.C. 154(b) by 0 days.

(21) Appl. No.: 11/528,177

(22) Filed: Sep. 26, 2006

(30) Foreign Application Priority Data

Sep. 30, 2005 (JP) .............................. 2005-288898

(51) Int. Cl.
*H05K 1/00* (2006.01)
(52) U.S. Cl. .............................. 439/83; 439/78; 439/74; 174/250; 174/255; 29/412; 29/417; 29/825; 29/829; 29/846
(58) Field of Classification Search .................. 439/83, 439/78, 74, 84, 876; 174/250, 255; 29/412, 29/417, 825, 829, 846
See application file for complete search history.

(56) References Cited

U.S. PATENT DOCUMENTS

| 4,655,517 | A | * | 4/1987 | Bryce ........................... 439/83 |
| 4,753,002 | A | * | 6/1988 | Chabane et al. .............. 29/728 |
| 5,076,796 | A | * | 12/1991 | Kusayanagi et al. .......... 439/83 |
| 5,410,452 | A | * | 4/1995 | Sinclair et al. ............. 361/791 |
| 5,548,486 | A | * | 8/1996 | Kman et al. ................. 361/791 |
| 5,709,574 | A | * | 1/1998 | Bianca et al. ................ 439/858 |
| 6,179,631 | B1 | * | 1/2001 | Downes et al. ............... 439/83 |
| 6,224,399 | B1 | * | 5/2001 | Yacoub ........................ 439/83 |
| 6,402,531 | B1 | * | 6/2002 | Legrady ....................... 439/83 |
| 6,991,486 | B2 | * | 1/2006 | Takai et al. .................. 439/247 |
| 2002/0023774 | A1 | * | 2/2002 | Drussel et al. .............. 174/250 |
| 2006/0009053 | A1 | * | 1/2006 | Broghammer et al. ........ 439/83 |
| 2006/0016069 | A1 | * | 1/2006 | Kent et al. .................... 29/825 |
| 2006/0157270 | A1 | * | 7/2006 | Ueno .......................... 174/250 |

FOREIGN PATENT DOCUMENTS

JP          06-72168 U       10/1994

* cited by examiner

*Primary Examiner*—Gary F. Paumen
(74) *Attorney, Agent, or Firm*—Peter Ganjian

(57) ABSTRACT

The present invention makes it possible to fix connector pins at low cost. Connector pins penetrate both a holding substrate and a main substrate. The connecter pins can be restrained from an outward radial direction by both wall surfaces of pin holes of the holding substrate, and wall surfaces of through-holes of the main substrate, thus improving upright-standability of the connector pins. The holding substrate is formed of a same raw substrate as the main substrate is formed of, and permanent resists which are laminated on the holding substrate, and ink used for silk screen printing to which the holding substrate is subjected, are made of a same material of the main substrate, so that fire resistance of the holding substrate and fire resistance of the main substrate are same. Therefore, if the main substrate clears a predetermined fire-resistance standard, the holding substrate also inevitably clears the predetermined fire-resistance standard.

9 Claims, 9 Drawing Sheets

DVD INTEGRATED CRT TELEVISION AND CONNECTOR FIXING STRUCTURE

CROSS-REFERENCES TO RELATED APPLICATIONS

The present application is related to the Japanese Patent Application No. 2005-288898, filed Sep. 30, 2005, the entire disclosure of which is expressly incorporated by reference herein.

BACKGROUND OF THE INVENTION

1. Field of the Invention

The present invention relates to a DVD integrated CRT television, and a connector fixing structure which is to be employed in the DVD integrated CRT television and other electronic equipment.

2. Description of the Related Art

Hitherto, as a connector fixing structure of this type, there is known a connector fixing structure in which a fixing member having pin holes formed therein is superposed and disposed on a substrate, thus improving upright-standing stability of connector pins (see, e.g., Japanese Utility Model Application Laid-Open No. Hei 6-72168).

According to the connector fixing structure, the connector pins are supported by both the fixing member and the substrate, so that the connector pins can be stably supported.

However, in the above-mentioned connector fixing structure, the fixing member is required to be prepared aside from the substrate, so that there is a problem that manufacturing expense is required for preparation of the fixing member. In particular, in a case where the substrate is to be used under elevated temperatures, the fixing member is required to be fire-resistant like the substrate, so that the fixing member must be made of fire-resistant material and, therefore, the cost for such a material is at stake.

BRIEF SUMMARY OF THE INVENTION

The present invention has been made with a view to addressing the forgoing problem of the related art connector fixing structure. The present invention discloses a connector fixing structure in which connector pins can be positively fixed at low cost, and a DVD integrated CRT television in which the connector fixing structure is to be employed.

One aspect of present invention provides a connector fixing structure for fixing a connector to a substrate, the connector fixing structure comprising: a holding substrate formed with respect to a same work substrate of which the substrate is formed, the holding substrate being separated from the substrate by cutting the work substrate after forming of the substrates; connector pins including standing-up portions on which the connector can be fitted, and press-fitting portions having lengths larger than at least two times a thickness of the work substrate; pin holes formed in the holding substrate, the press-fitting portions penetrating the pin holes; through-holes formed in the substrate, the press-fitting portions projecting from the holding substrate being inserted through the through-holes from the side of a component-mounted surface of the substrate in such a manner that the holding substrate comes into close contact with the component-mounted surface of the substrate; and pads formed on a surface of the substrate which is opposite to the component-mounted surface of the substrate, the pads being capable of being soldered to the press-fitting portions penetrating the opposite surface.

In the connector fixing structure of the present invention which is constructed as discussed above, the holding substrate is produced by forming the holding substrate on a same work substrate for the substrate to which the connector is fixed. Concretely, the substrate and the holding substrate are separated from each other by cutting the same work substrate. Prior to the cutting of the work substrate, both the substrate and the holding substrate are subjected to respective substrate-forming processes which include drilling, formation of copper patterns, formation of permanent resists, and mounting of the components. The connector pins comprise standing-up portions on which the connector can be fitted, and press-fitting portions having lengths larger than at least two times a thickness of the substrate. The holding substrate is formed with pin holes through which the press-fitting portions of the connector pins can be inserted. The substrate is formed with through-holes through which the press-fitting portions projecting from the holding substrate are inserted from the side of a component-mounted surface of the substrate in such a manner that the holding substrate comes into close contact with the component-mounted surface of the substrate. Moreover, pads are formed on a surface of the substrate which is opposite to the component-mounted surface of the substrate, and can be soldered to the press-fitting portions penetrating the surface of the substrate which is opposite to the component-mounted surface of the substrate.

Another aspect of present invention provides a DVD integrated CRT television comprises a sub-substrate formed with respect to a same work substrate of high fire-resistant material, of which the main substrate is formed, the sub-substrate being separated from the main substrate by cutting the work substrate after forming of the substrates; a holding substrate provided between the main substrate and the sub-substrate in the work substrate, and formed in the same manner as the main substrate and the sub-substrate, the holding substrate being separated from the main substrate and the sub-substrate by cutting the work substrate after the forming of the substrates, and the holding substrate having a printed surface including an indicator which indicates properties of a raw substrate formed by causing the holding substrate as well as the main substrate and the sub-substrate to be subjected to silk screen printing; connector pins comprising substantially cylindrical standing-up portions having substantially fixed diameters, to which the connector coupled to a degaussing coil provided around a CRT can be fitted on, substantially cylindrical press-fitting portions having substantially fixed diameters and the lengths larger than at least two times a thickness of the work substrate, and flange portions provided between the standing-up portions and the press-fitting portions and having diameters larger than those of the standing-up portions and the press-fitting portions; substantially square-shaped pin holes formed in the holding substrate so as to have intervals between opposite sides thereof which are smaller than diameters of the press-fitting portions and so as to have diagonal lengths larger than the diameters of the press-fitting portions, the press-fitting portions being inserted through the substantially square-shaped pin holes from the side of the printed surface until the flange portions are abutted against the holding substrate; through-holes formed in the main substrate, the press-fitting portions projecting from the holding substrate being inserted through the through-holes so as to penetrate from the side of a component-mounted surface of the main substrate to the side of a pattern surface of the main substrate in such a manner that the surface of the holding substrate which is opposite to the printed surface of the holding substrate comes into close contact with the component-mounted surface of the main substrate; and pads formed on the pattern surface of the main substrate and capable of being soldered to the press-fitting portions penetrating the pattern surface.

As discussed above, according to the present invention, it is unnecessary to carry out the respective substrate-forming process for forming the holding substrate only, so that it is possible to reduce manufacturing cost. In addition, according to the present invention, the following effects can be obtained.

It is possible to cause the connector pins to be securely fixed to the holding substrate.

The insertion of the connector pins through the pin holes can cause the pin holes to be deformed, so that errors in size of the pin holes can be tolerated.

The properties of the holding substrate can be represented.

The holding substrate can also have fire resistance.

The connector pins can be positioned at insertion positions thereof.

A degaussing coil can be coupled to the substrate.

The holding substrate can be formed by using a region between the main substrate and the sub-substrate in the same raw substrate.

These and other features, aspects, and advantages of the invention will be apparent to those skilled in the art from the following detailed description of preferred non-limiting exemplary embodiments, taken together with the drawings and the claims that follow.

BRIEF DESCRIPTION OF THE DRAWINGS

It is to be understood that the drawings are to be used for the purposes of exemplary illustration only and not as a definition of the limits of the invention. Throughout the disclosure, the word "exemplary" is used exclusively to mean "serving as an example, instance, or illustration." Any embodiment described as "exemplary" is not necessarily to be construed as preferred or advantageous over other embodiments.

Referring to the drawings in which like reference character(s) present corresponding parts throughout.

DETAILED DESCRIPTION OF THE INVENTION

The detailed description set forth below in connection with the appended drawings is intended as a description of presently preferred embodiments of the invention and is not intended to represent the only forms in which the present invention may be constructed and or utilized.

Figure 1:
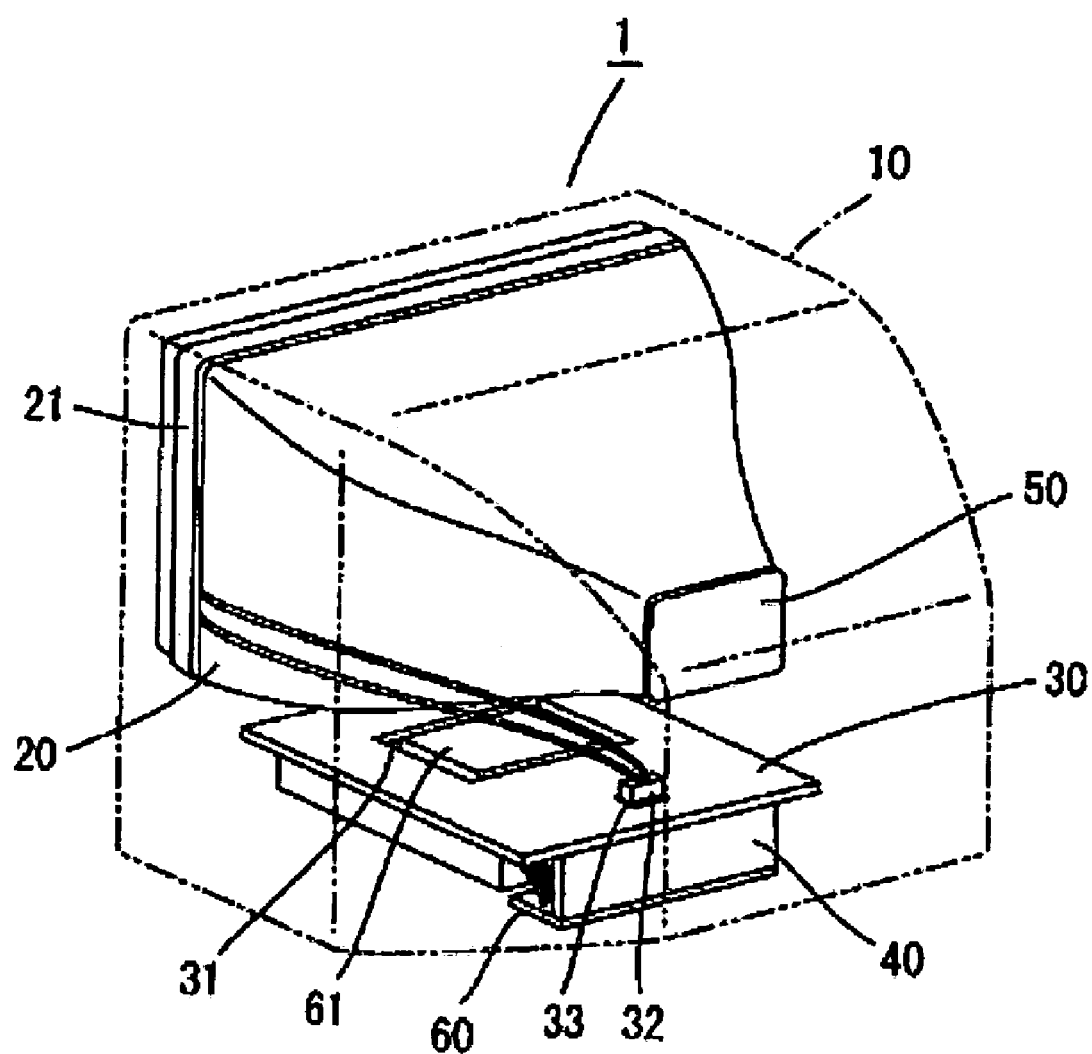
FIG. 1 is an exemplary illustration of a schematic perspective view of a DVD integrated CRT television according to the present invention.
Figure 2:
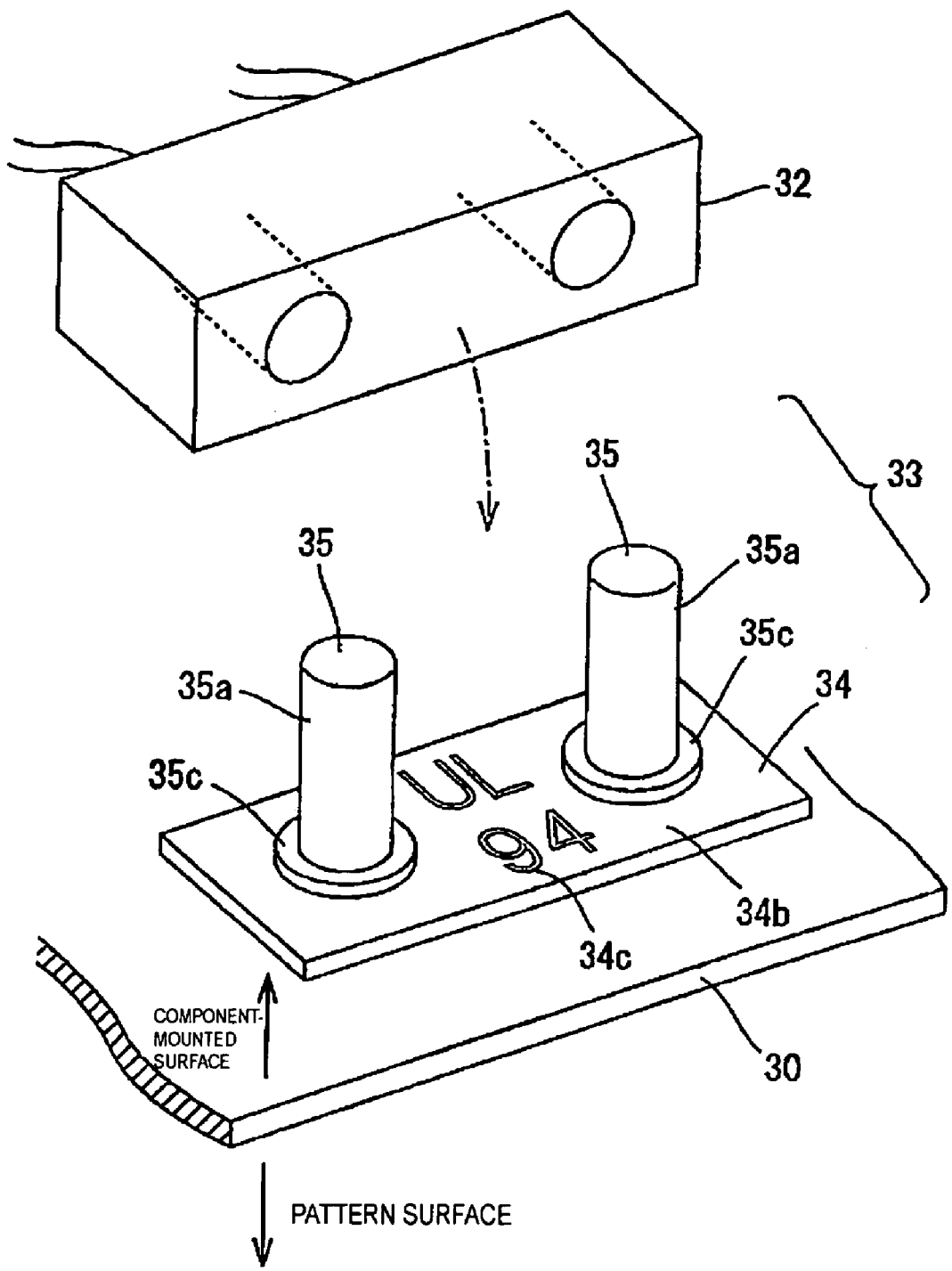
FIG. 2 is an exemplary illustration of a schematic perspective view of a connector fixing structure according to the present invention.

Now, an embodiment of the present invention will be discussed hereinafter with reference to the accompanying drawings. FIG. 1 is a schematic perspective view of a DVD integrated CRT television according to the present invention. FIG. 2 is a schematic perspective view of a connector fixing structure according to the present invention.

The embodiment of the present invention will be discussed hereinafter in the following order:

(1) Construction of the DVD-integrated CRT television;

(2) Construction of connector fixing structure;

(3) Method for producing the connector fixing structure; and (4) Summary.

(1) Structure of the DVD integrated CRT television:

Referring to FIG. 1, there is schematically illustrated an internal structure of the DVD integrated CRT television according to the embodiment of the present invention. The DVD integrated CRT television 1 includes a housing body 10 within which a CRT 20 is housed and attached to the housing body 10 with a displaying screen thereof facing the front. Under the CRT 20, a main substrate 30 is arranged so as to be substantially horizontal. A DVD controlling substrate 60 for controlling a DVD unit 61 is attached via a connection substrate 40 to the main substrate 30. Moreover, a CRT substrate 50 is connected to the main substrate 30 through a cable which is not shown. The CRT substrate 50 is attached to a portion of the CRT 20 which is adjacent a neck portion of the CRT 20. Incidentally, the connection substrate 40 and the CRT substrate 50 correspond to sub-substrates in the present invention.

On the main substrate 30, there are mounted: a power supply circuit generating required power at respective sections from a normal-power supply; a tuner circuit for obtaining a television radio wave of a specified carrier frequency and generating an intermediate frequency signal; a video-signal processing circuit for taking out a synchronizing signal, a color signal and the like from the intermediate frequency signal and generating a video signal which is then outputted to the CRT 20; a speech signal processing circuit for generating from the intermediate frequency signal a speech signal which can be outputted to a speaker; an oscillating circuit for generating a pulse signal which is required for driving of the CRT 20; a flyback transformer for generating a high voltage which is required for driving of the CRT 20; a deflecting circuit for causing an electron beam to be deflected horizontally and vertically; a microcomputer controlling the respective sections, and the like. Moreover, an opening 31 is formed in a substantially central portion of the main substrate 30 and a drive portion of the DVD unit 61 is arranged in the opening 31.

A degaussing coil 21 is provided at the CRT 20 so as to surround the CRT 20. Windings of the degaussing coil 21 are extended and coupled to a connector 32. The connector 32 is fitted on a connector fixing structure 33 including the main substrate 30, whereby an electrical connection between the degaussing coil 21 and the main substrate 30 is made. The main substrate 30 outputs electrical current for degaussing the CRT 20 by the degaussing coil 21.

Figure 3:
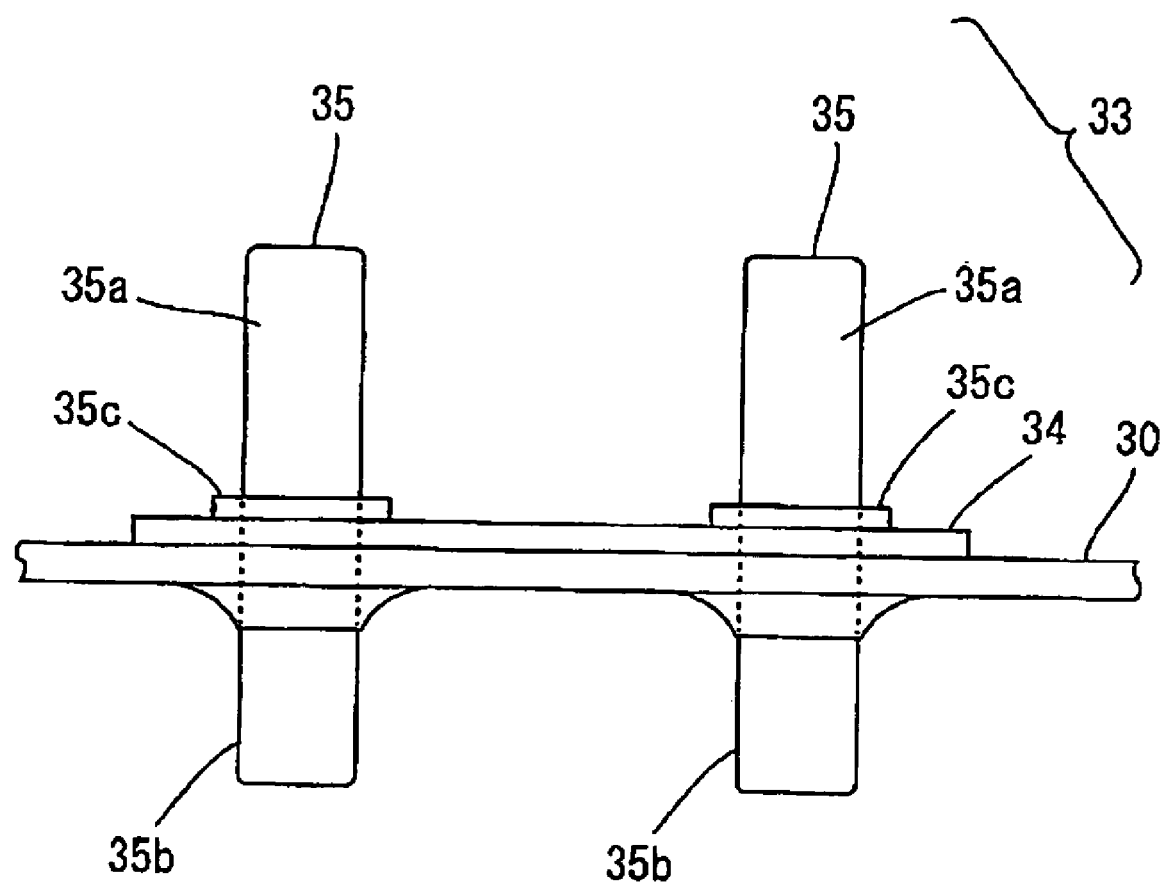
FIG. 3 is an exemplary illustration of a schematic side view of the connector fixing structure.

(2) Construction of Connector Fixing Structure:

FIG. 2 shows the connector fixing structure as viewed from the oblique direction. FIG. 3 shows the connector fixing structure as viewed from the horizontal direction. Referring to FIG. 2, the connector fixing structure 33 is comprised of the main substrate 30, a holding substrate 34, and connector pins 35, 35. The connector pins 35, 35 penetrate the main substrate 30 and the holding substrate 34. Standing-up portions 35a, 35a of the connector pins 35, 35 project on the side of a component-mounted surface of the main substrate 30. Incidentally, the main substrate 30 is a one-surface substrate and a surface of the main substrate 30 which is opposite to the component-mounted surface is a pattern surface. In the pattern surface, a copper pattern is selectively formed and a permanent resist is selectively formed on the copper pattern. Press-fitting portions 35b, 35b of the connector pins 35, 35 project on the side of the pattern surface.

As shown in FIG. 3, the press-fitting portions 35b, 35b which project on the side of the pattern surface are soldered to the main substrate 30, whereby the connector pins 35, 35 and the main substrate 30 are fixed to each other. Moreover, the standing-up portions 35a, 35a and the press-fitting portions 35b, 35b of the connector pins 35, 35 are each formed into a substantially cylindrical shape which has a fixed diameter. The connector pins 35, 35 have circumferential flange portions 35c, 35c which are formed between the standing-up portions 35a, 35a and the press-fitting portions 35b, 35b by causing diameters between the standing-up portions 35a, 35a and the press-fitting portions 35b, 35b to be increased. The press-fitting portions 35b, 35b penetrate the holding substrate 34 until the flange portions 35c, 35c are abutted against the holding substrate 34. The press-fitting portions 35b, 35b which project on the side of the pattern surface are soldered to the main substrate 30, whereby the holding substrate 34 is pressed against the flange portions 35c, 35c and adhered to the component-mounted surface of the main substrate 30.

The standing-up portions 35a, 35a of the connector pins 35, 35 uprightly stand with respect to the main substrate 30. The standing-up portions 35a, 35a have the substantially same diameter as engaging holes 32a, 32a of a substantially cylindrical shape which are formed in the connector 32 have. Moreover, an arranging pitch between the connector pins 35, 35 is designed so as to be equal to that between the engaging holes 32a, 32a, so that the standing-up portions 35a, 35a can be smoothly fitted into the engaging holes 32a, 32a. The windings of the degaussing coil 21 are led into the engaging holes 32a, 32a. Therefore, by causing the standing-up portions 35a, 35a to be fitted into the engaging holes 32a, 32a, the electrical connection between the windings of the degaussing coil 21 and the connector pins 35, 35 is made. The connector pins 35, 35 are soldered at the press-fitting portions 35b, 35b to the main substrate 30, so that the electrical connection between the degaussing coil 21 and the main substrate 30 is made.

Figure 4:
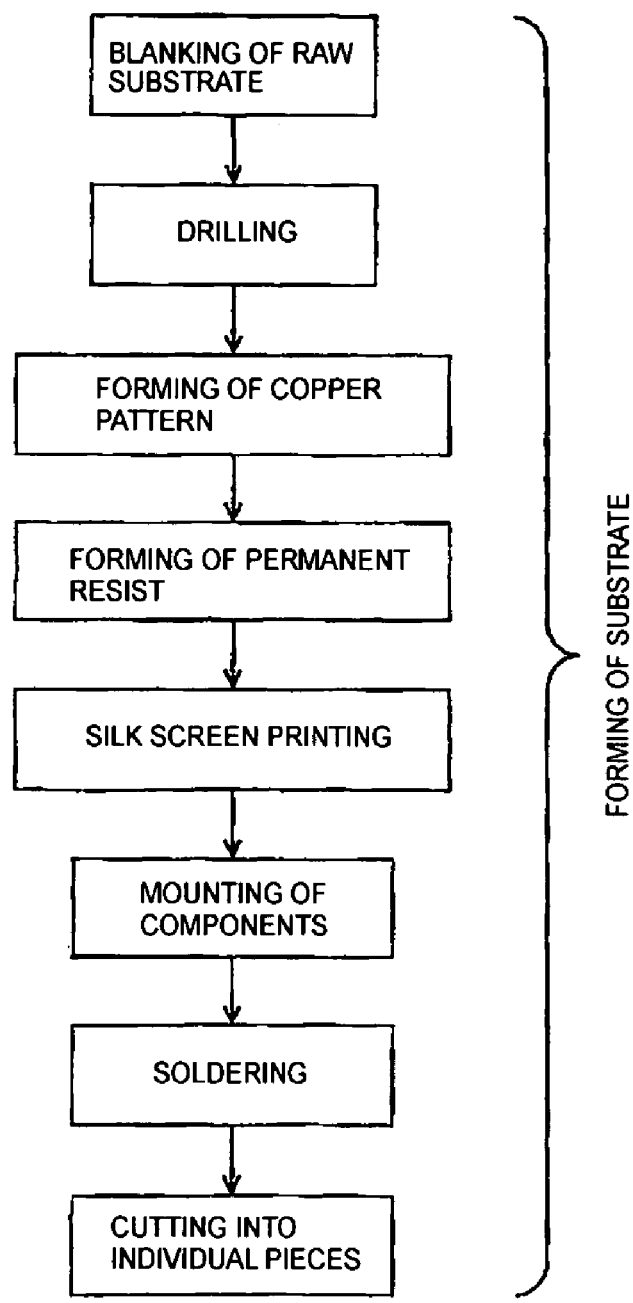
FIG. 4 is an exemplary illustration of a flow chart which is of assistance in explaining steps for forming substrates.

(3) Method for Producing the Connector Fixing Structure:

Now, a method for producing the connector fixing structure 33 described above will be discussed hereinafter. First of all, one example of methods for preparing the main substrate 30 will be discussed. Referring to FIG. 4, there is schematically illustrated preparing flow of the main substrate 30. First of all, a work substrate is prepared by blanking a raw substrate into a substantially rectangular shape. As the raw substrate, there may be employed a raw plate which is formed of fire-resistant resin, for example, epoxy system resins or phenol system resins and has a fixed thickness. Next, the work substrate is subjected to drilling by a drill or router. Moreover, a copper pattern is formed on the work substrate after the drilling. In the illustrated example, the main substrate 30 is a one-surface substrate as discussed above, so that the forming of the copper pattern is carried out with respect to only one surface of the work substrate. The forming of the copper pattern may be carried out by either subtractive process or additive process. After the forming of the copper pattern is completed, application of an insulating resin onto the pattern surface of the work substrate on which the copper pattern is formed is selectively performed, to thereby form the permanent resist.

After the permanent resist is formed, the both surfaces of the work substrate are subjected to silk screen printing. Thus, it is possible to carry out desired marking with respect to the work substrate. Then, various components are mounted on the work substrate formed as described above. In the illustrated embodiment, the main substrate 30 is a one-surface substrate and the various components are mounted on the surface of the work substrate which is opposite to the pattern surface of the work substrate. Leads from the various components are extended to the pattern surface of the work substrate through holes which are previously formed in the work substrate at the drilling step. The leads of the various components are then soldered to the pattern surface of the work substrate. Thus, the mounting of the various components are completed. In this embodiment, soldering between pads formed on the pattern surface and the leads of the various components is carried out by dipping the work substrate into a solder bath. Finally, the work substrate is cut into individual pieces, whereby the main substrate 30 is produced. Incidentally, the above-mentioned steps are merely one example. Any suitable other steps may be added to the method and the order of the steps may be changed.

Figure 5:
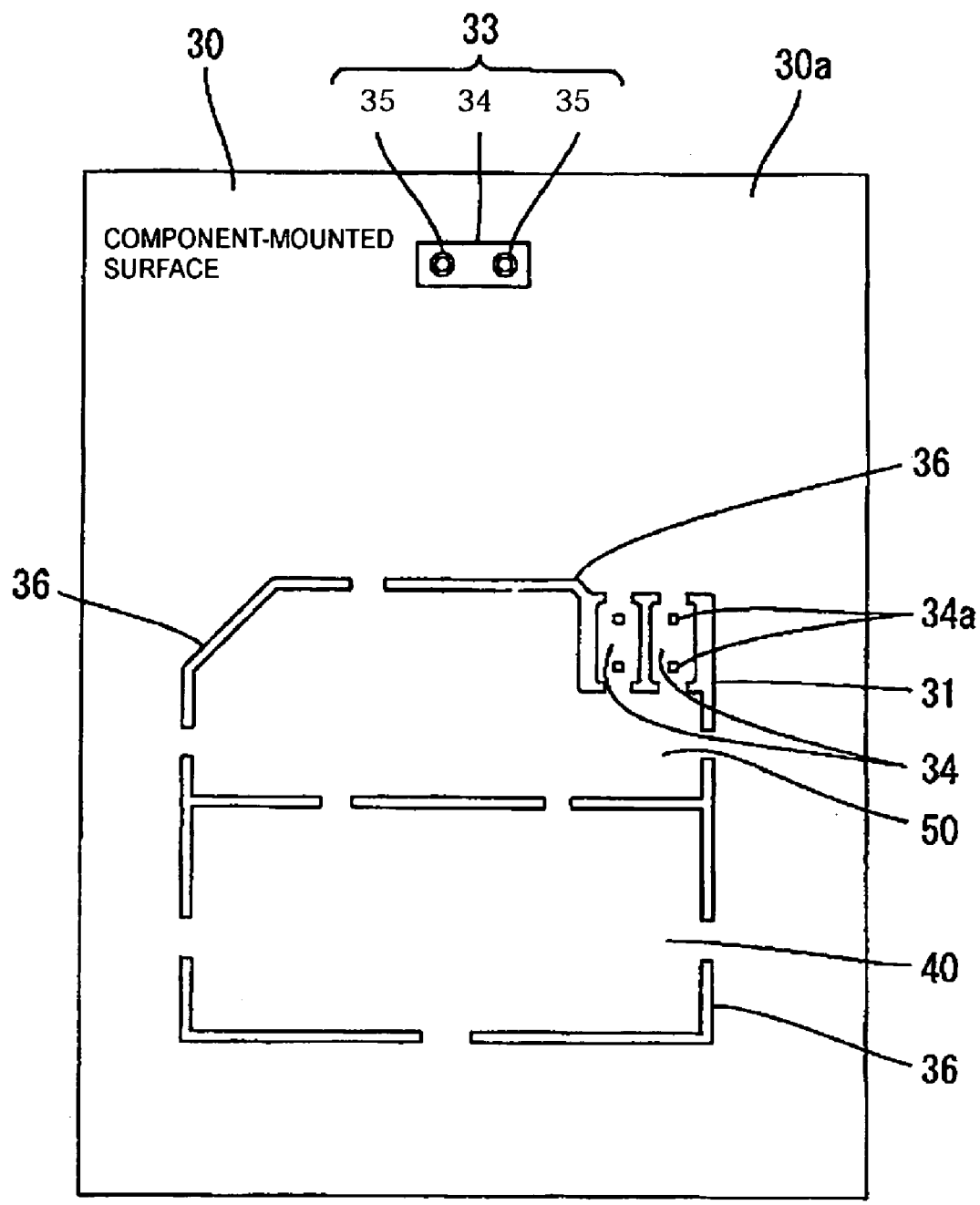
FIG. 5 is an exemplary illustration of a schematic front view of a work substrate.

Referring to FIG. 5, there is illustrated the work substrate 30a which is not yet subjected to the cutting process. In the work substrate 30a, the main substrate 30 of a rectangular shape in outline is formed. The connection substrate 40 and the CRT substrate 50 which are regarded as the sub-substrates occupy regions of the main substrate 30 which are present on the inside of the opening 31 formed in the main substrate 30. Incidentally, the mounted components except for the connector fixing structure 33 are removed in FIG. 5 for clarity of illustration. Line-shaped slits 36 are formed among the respective substrates 30, 40, 50. The substrates 30, 40, 50 are partitioned by the line-shaped slits 36. At the cutting step, the substrates 30, 40, 50 which are partitioned by the line-shaped slits 36 are completely separated from one another at the slits 36. Thus, the substrates 30, 40, 50 are independently produced. When the cutting is carried out, the work substrate may be subjected to machining by a router or the like. The cutting may be performed by manually cutting the work substrate at the slits 36.

Thus, the respective substrates 30, 40, 50 are produced by causing the same work substrate 30a to be subjected to the processes of from the drilling to the soldering. Therefore, the respective substrates 30, 40, 50 are formed on the same raw substrate. As discussed above, the respective substrates 30, 40, 50 can be prepared from the same work substrate 30a and the respective processes can be used commonly for the preparation of the respective substrates 30, 40, 50, thus reducing the manufacturing cost of the respective substrates 30, 40, 50.

Figure 6:
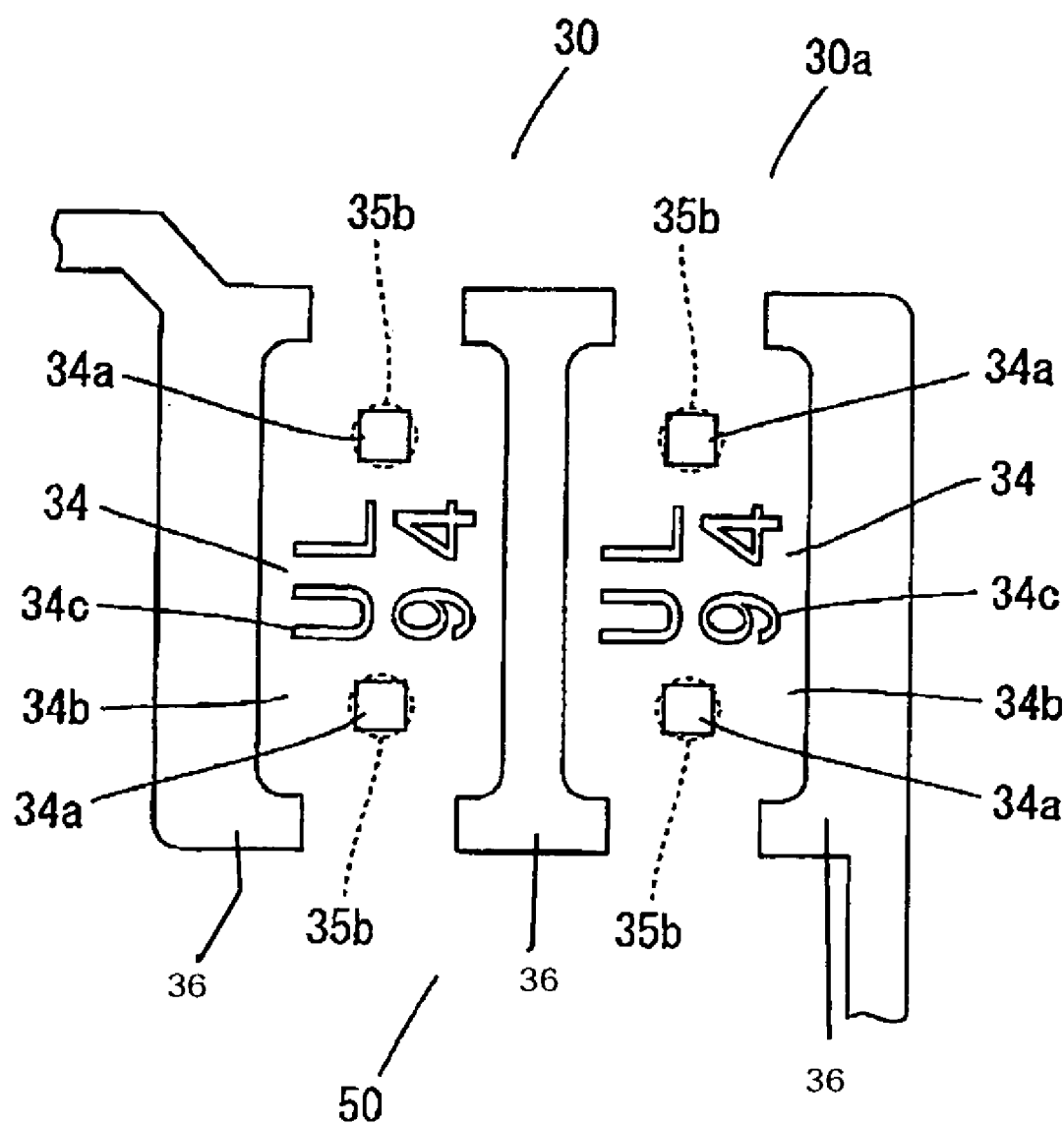
FIG. 6 is an exemplary illustration of a schematic front view of a holding substrate.

Referring to FIG. 6, there is illustrated a connecting region of the work substrate 30a between the main substrate 30 and the CRT substrate 50 regarded as the sub-substrate.

The slits 36 are formed in the region of the work substrate 30a between the main substrate 30 and the CRT substrate 50. Two holding substrates 34, 34 each occupy a region of the work substrate 30a between adjacent slits 36. That is, the main substrate 30 and the CRT substrate 50 are connected to each other through the holding substrates 34, 34. The holding substrates 34, 34 are each formed into a substantially rectangular-shape and formed with a pair of pin holes 34a, 34a. The pin holes 34a, 34a penetrate the holding substrates 34, 34 and have each a square shape.

In FIG. 6, the outlines of the press-fitting portions 35b, 35b of the connector pins 35, 35 are shown by broken lines in order that the press-fitting portions 35b, 35b can be distinguished from the pin holes 34a, 34a, 34a, 34a. The square-shaped pin holes 34a, 34a, 34a, 34a are formed in such a manner that lengths of one sides of the square-shaped pin holes are smaller than the diameters of the press-fitting portions 35b, 35b of the connector pins 35, 35 and diagonal lengths of the square-shaped pins 34a, 34a, 34a, 34a are larger than the diameters of the press-fitting portions 35b, 35b of the connector pins 35, 35.

Indicators 34c representing a fire-resistance grade of the holding substrates are formed on printed surfaces 34b, 34b of the holding substrates 34, 34 by silk screen printing and are disposed between the pin holes 34a, 34a. The holding substrates 34, 34 are formed of the same material as the respective substrates 30, 40, 50, and prepared by the same processes as the respective substrates 30, 40, 50, so that the respective substrates 30, 40, 50 and the holding substrates 34, 34 are of the same fire-resistance grade. Incidentally, the indicators 34c provided on the holding substrates 34, 34 are not limited to indicators directly representing the fire-resistance grade and may be indicators representing the name of the substrate material or the like. That is, the indicators may be any suitable indicators representing the properties of the material of which the substrates are formed. For example, if the name of the material of the substrates can be recognized from the indicators, to what extent of the fire resistance the holding substrates 34, 34 have can be judged.

The work substrate 30a is cut into individual pieces, to thereby cause the holding substrates 34, 34 to be separated from the main substrate 30 and the CRT substrate 50 as small substrates. Next, insertion of the connector pins 35, 35 through the separated holding-substrate 34 is carried out. The press-fitting of the connector pins 35, 35 is carried out in such a manner that the press-fitting portions 35b, 35b are inserted through the pin holes 34a, 34a previously formed in the holding substrate 34. At this time, the insertion of the press-fitting portions 35b, 35b is carried out from the side of the printed surface 34b on which the indicator 34c representing the fire-resistance grade is formed by the silk screen printing. Furthermore, the insertion of the press-fitting portions 35b, 35b through the pin holes 34a, 34a is carried out until the flange portions 35c, 35c which are made so as to have the diameters larger than the diameters of the press-fitting portions 35b, 35b, are abutted against the peripheries of the pin holes 34a, 34a. In this condition, the standing-up portions 35a, 35a of the connector pins 35, 35 uprightly stand from the printed surface 34b on which the indicator 34c representing the fire-resistance grade is formed. The press-fitting portions 35b, 35b are made so as to have lengths longer than two times the thickness of the work substrate 30a, so that the press-fitting portions 35b, 35b project further than the thickness of the main substrate 30, from the holding substrate 34.

As discussed above, the length of the one side of each of the square-shaped pin holes 34a, 34a is smaller than the diameter of the press-fitting portions 35b, 35b of the connector pins 35, 35, and the diagonal length of the square-shaped pin hole 34a is larger than the diameter of the press-fitting portions 35b, 35b. Therefore, when the press-fitting portions 35b, 35b are inserted through the pin holes 34a, 34a, the pin holes 34a, 34a are deformed by the press-fitting portions 35b, 35b in such a manner that central regions of the respective sides of the pin holes 34a, 34a are stretched outwardly. Such outwardly stretched regions of the pin holes 34a, 34a produce elastic forces which tend to prevent deformation of the press-fitting portions 35b, 35b after having been inserted through the pin holes 34a, 34a, so that the connector pins 35, 35 and the holding substrate 34 can be securely fixed to each other.

Moreover, in the case where the pin holes 34a, 34a are each formed into the square shape, when the press-fitting portions 35b, 35b are inserted through the pin holes 34a, 34a, only the central regions of the respective sides of the square-shaped pin holes 34a, 34a come into contact with the press-fitting portions 35b, 35b and regions of the square-shaped pin holes 34a, 34a which are adjacent the corners of the pin holes 34a, 34a do not come into contact with the press-fitting portions 35b, 35b. This makes it possible to suitably control resistance which is generated when the press-fitting portions 35b, 35b are inserted through the pin holes 34a, 34a, and elastic force which is produced when the connector pins 35, 35 and the holding substrate 34 are fixed to each other. Furthermore, the diagonal length of each of the pin holes 34a, 34a is larger than the diameter of each of the press-fitting portions of the connector pins 35, 35. This makes it possible to facilitate the insertion of the press-fitting portions 35b, 35b through the pin holes 34a, 34a.

That is, if the requirements that the length of each of the sides of each of the pin holes 34a, 34a is smaller than the diameter of each of the press-fitting portions 35b, 35b of the connector pins 35, 35 and the diagonal length of each of the sides of each of the pin holes 34a, 34a is larger than the diameter of each of the press-fitting portions 35b, 35b of the connector pins 35, 35 are satisfied, even if variations in shapes of the pin holes 34a, 34a are produced within a range of such requirements, it is possible to fix the connector pins 35, 35 and to easily insert the press-fitting portions 35b, 35b through the pin holes. Therefore, it is unnecessary to increase an accuracy in the formation of the pin holes 34a, 34a, and it is possible to increase the number of substrates to be superposed one another and subjected to the drilling, and reduce the manufacturing cost. Incidentally, the holding substrate 34 is small, so that even if forced insertion of the press-fitting portions 35b, 35b through the holding substrate 34 is carried out while fixing the holding substrate 34 by a specialized jig or manually holding it, the holding substrate 34 is not made flex. Therefore, it is possible to easily carry out the insertion of the connector pins 35, 35.

Figure 7:
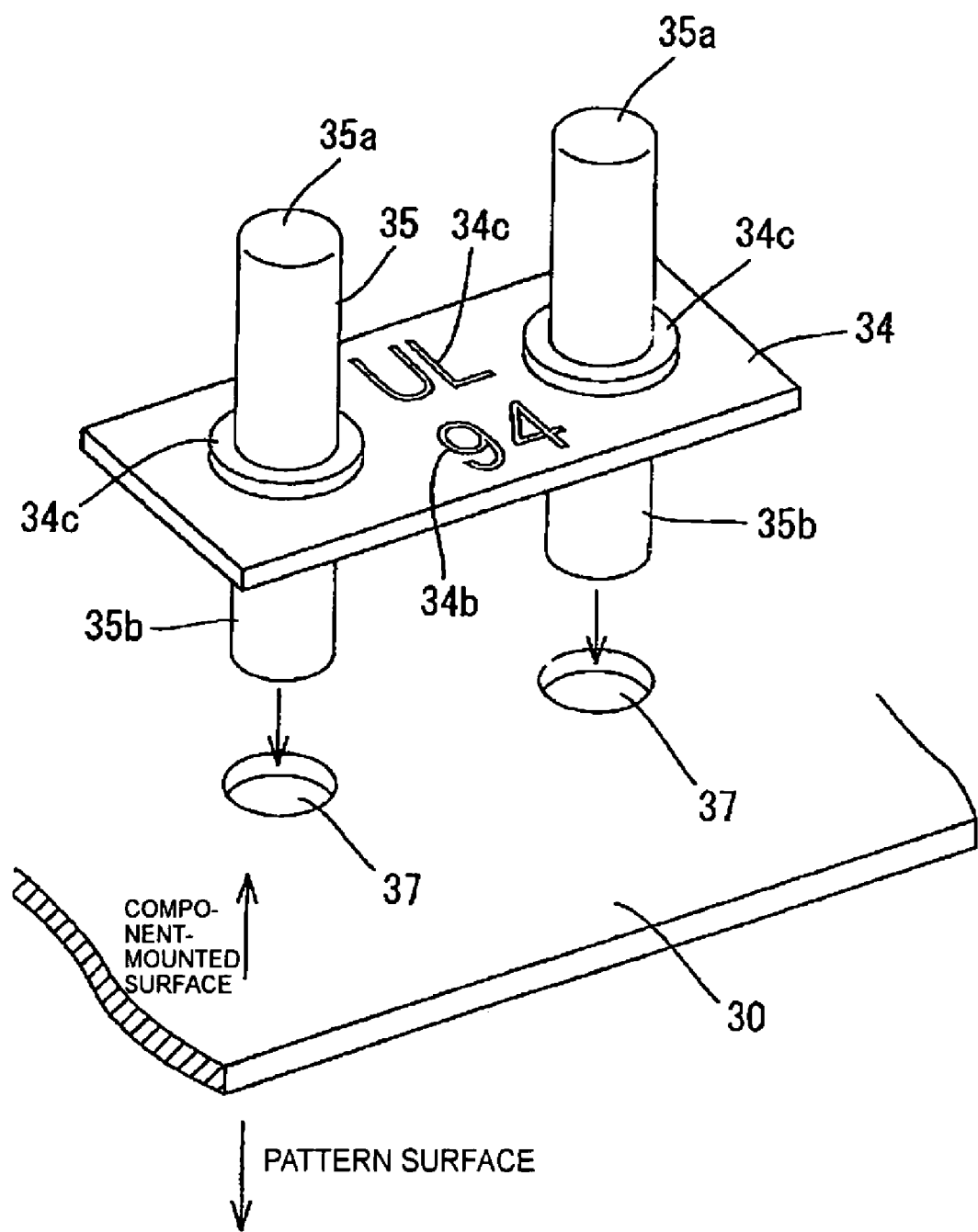
FIG. 7 is an exemplary illustration of a schematic perspective view which is of assistance in explaining mounting of connector pins and the holding substrate to a main substrate.

After the mounting of the connector pins 35, 35 to the holding substrate 34 is completed in the manner as discussed above, mounting of an assembly comprising the holding substrate 34 and the connector pins 35, 35 to the main substrate 30 is carried out. Referring now to FIG. 7, there is illustrated a state where the assembly comprising the holding substrate 34 and the connector pins 35, 35 is mounted to the main substrate 30. As shown in FIG. 7, the main substrate 30 is formed with a pair of through-holes 37, 37 through which the connector pins 35, 35 are to be inserted. An arranging pitch between the through-holes 37, 37 is equal to that between the pin holes 34a, 34a of the holding substrate 34. Incidentally, the mounting of the connector pins 35, 35 is carried out in the same manner as mounting of various components is carried out after the work substrate 30a is subjected to the silk screen printing.

The press-fitting portions 35b, 35b which are projected from the holding substrate 34 are inserted through the through-holes 37, 37 formed in the main substrate 30, from the side of the component-mounted surface. An arranging pitch between the connector pins 35, 35 inserted through the pin holes 34a, 34a of the holding substrate 34 is restricted by the pin holes 34a, 34a which are formed in the holding substrate 34 so as to be spaced apart from each other at the arranging pitch equal to that of the through-holes 37, 37, thus enabling smooth insertion of the press-fitting portions 35b, 35b through the through-holes 37, 37. The through-holes 37, 37 are each formed to have a circular-shape having a diameter larger than that of each of the press-fitting portions 35b, 35b, so that the press-fitting portions 35b, 35b can be inserted through the through-holes 37, 37 without being subjected to frictional resistance. Moreover, the press-fitting portions 35b, 35b each have a fixed diameter, so that the insertion of the press-fitting portions 35b, 35b through the through-holes 37, 37 can be carried out until the holding substrate 34 comes into close contact with the main substrate 30. When the holding substrate 34 comes into close contact with the main substrate 30, the standing-up portions 35a, 35a of the connector pins 35, 35 stand upright relative to the main substrate 30. Moreover, the printed surface 34b of the holding substrate 34, on which the indicator 34c representing the fire-resistance grade is formed by the silk screen printing, is exposed on the side of the component-mounted surface.

Figure 8:
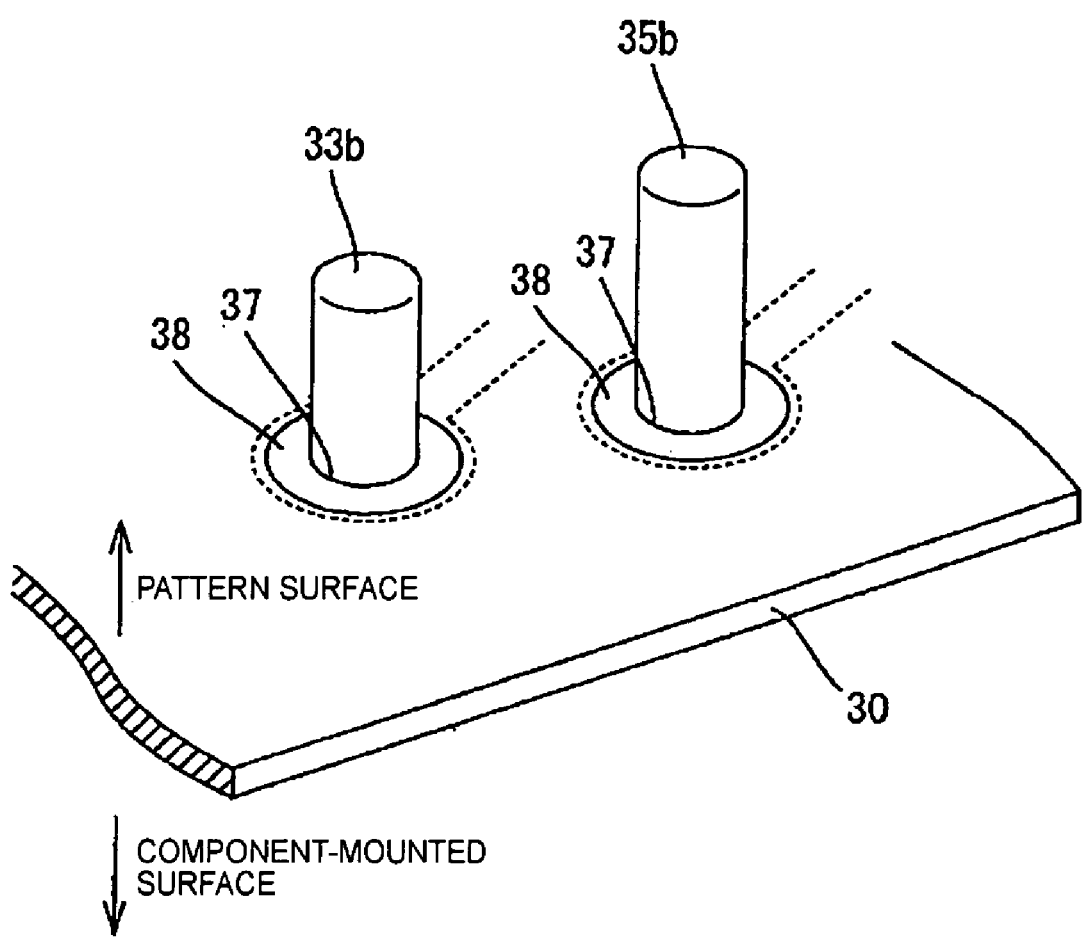
FIG. 8 is an exemplary illustration of a schematic perspective view of the main substrate having pads formed thereon.

In the condition where the connector pins 35, 35 are inserted through the holding substrate 34 as discussed above, the press-fitting portions 35b, 35b are projected further than the thickness of the holding substrate 34, so that tip end regions of the press-fitting portions 35b, 35b are projected further from the main substrate 30 having the thickness equal to that of the holding substrate 34. Referring now to FIG. 8, there is illustrated the pattern surface of the main substrate 30 having the through-holes 37, 37 formed therein. As shown in FIG. 8 by broken lines, copper patterns are formed on the pattern surface so as to surround the through-holes 37, 37. Permanent resists are applied onto the copper patterns. A pair of pads 38, 38 in which the copper patterns are exposed are provided by causing the permanent resists to be cut into substantially circular shapes. Therefore, when the assembly comprising the connector pins 35, 35 and the holding substrate 34 is mounted to the main substrate 30 as discussed above, the pads 38, 38 and the press-fitting portions 35b, 35b projecting from the main substrate 30 become substantially perpendicular to each other.

After the mounting of the components to the main substrate 30 is completed as discussed above, soldering is carried out. The pads 38, 38 and the press-fitting portions 35b, 35b projecting from the main substrate 30 are substantially perpendicular to each other, so that the soldering may be carried out while causing the pattern surface of the work substrate 30a to face downward and dipping the work substrate 30a into a solder bath. This makes it possible that molten solder adheres to the pads 38, 38 which are excellent in wettability as compared to the permanent resists, and the press-fitting portions 35b, 35b, while extending along the pads 38, 38 and the press-fitting portions 35b, 35b. Incidentally, the projecting amount of the press-fitting portions 35b, 35b is restricted by the flange portions 35c, 35c, so that there are no possibilities that the projecting amount of the press-fitting portions 35b, 35b becomes uneven, the projecting amount of the opposite standing-up portions 35a, 35a become uneven, and the mounting of the connector 32 is prevented. In this way, such a connector fixing structure 33 as shown in FIGS. 2 and 3 can be produced.

In the connector fixing structure 33 produced as described above, the connector pins 35, 35 penetrate both the holding substrate 34 and the main substrate 30. Therefore, the connecter pins 35, 35 can be restrained from an outward radial direction by both wall surfaces of the pin holes 34a, 34a of the holding substrate 34, and wall surfaces of the through-holes 37, 37, thus improving upright-standability of the connector pins 35, 35. In particular, the holding substrate 34 tightly contacts the main substrate 30, so that the posture of the holding substrate 34 is stably kept and the upright-standability of the connector pins 35, 35 can be improved. Therefore, insertion of the connector pins 35, 35 into the connector 32 can be smoothly carried out. Moreover, the holding substrate 34 is made of the same raw substrate as the main substrate 30 is made of, and the permanent resists laminated on the main substrate 30 and ink used for the silk pattern printing are made of the same material as the main substrate 30, so that the holding substrate 34 has the same fire resistance as the main substrate 30. Therefore, if the fire resistance of the main substrate 30 clears a predetermined standard, the fire resistance of the holding substrate 34 also clears the predetermined standard.

Moreover, the printed surface which indicates the fire resistance of the holding substrate 34 can be visually recognized from the side of the component-mounted surface, so that the fire resistance of the holding substrate 34 can be easily confirmed. Both the holding substrate 34 and the main substrate 30 are formed of the same material, so that they exhibit the same coefficient of linear expansion. Therefore, at the time of using the DVD integrated CRT television 1 having the connector fixing structure incorporated therein, even if heat is applied to the main substrate 30, both the holding substrate 34 and the main substrate 30 are thermally changed in size to the same degree and the upright-standability of the connector pins 35, 35 can be maintained. Moreover, the holding substrate 34 is prepared by being subjected to the respective substrate-forming processes of from the drilling to the soldering, so that the holding substrate 34 is subjected to the same thermal hysteresis as the main substrate 30 to which the holding substrate 34 is mounted is subjected to. Therefore, it is possible to cause rates of change in size of the holding substrate 34 and the main substrate 30 to become closer to each other, thus further maintaining the upright-standability of the connector pins 35, 35.

After the soldering is completed, the work substrate 30a is cut into the individual substrates 30, 40, 50 and the holding substrates 34, 34 so as to cause the substrates to be separated from one another. Assembling of the DVD integrated CRT television 1 is carried out by using the independent substrates 30, 40, 50. On the other hand, the mounting of the connector pins 35, 35 to the independent holding substrates 34, 34 is carried out. The holding substrates 34, 34 having the connecter pins 35, 35 mounted thereto are then mounted and soldered to the next work substrate 30a. That is, the holding substrates 34, 34 which are obtained from the work substrate 30a at the time of the producing of the preceding substrates 30, 40, 50 are mounted to main substrates 30 which are be newly prepared.

Figure 9:
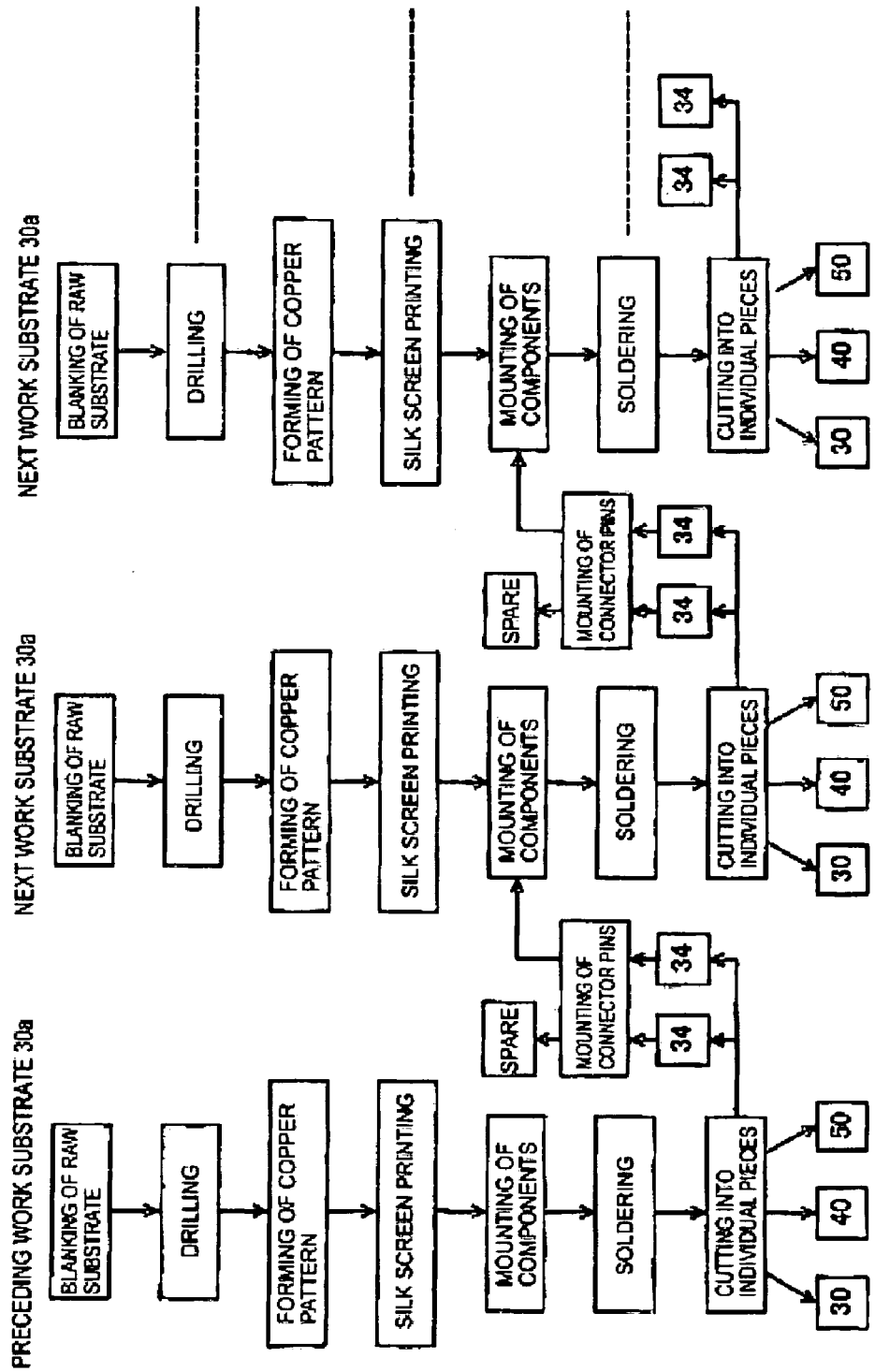
FIG. 9 is an exemplary illustration of a flow chart which is assistance in explaining the forming of the substrates and supply of the holding substrate.

Referring now to FIG. 9, there is schematically illustrated a flow of forming processes of the respective substrates and procedures for supply of the holding substrates 34. As shown in FIG. 9, the holding substrates 34, 34 are produced at the cutting steps in the processes for producing the respective substrates 30, 40, 50. The connector pins 35, 35 are then mounted to one of the produced holding substrates 34, 34. An assembly which comprises the connector pins 35, 35 and the holding substrate 34 is mounted to a next work substrate 30a from which next substrates 30, 40, 50 are to be produced. Moreover, this work substrate 30a is cut, to thereby produce new holding substrates 34, 34. One of the holding substrates 34, 34 can be used for producing a still next main substrate 30. Incidentally, although the two holding substrates 34, 34 are produced from one work substrate 30a, only one holding substrate 34 is to be mounted to the work substrate 30a, so that the other holding substrate 34 can be stored as a spare holding substrate.

(4) Summary:

As discussed above, the connector pins 35, 35 penetrate both the holding substrate 34 and the main substrate 30 in the connector fixing structure according to the present invention. Therefore, the connecter pins 35, 35 can be restrained from the outward radial direction by both the wall surfaces of the pin holes 34a, 34a of the holding substrate 34, and the wall surfaces of the through-holes 37, 37, thus improving the upright-standability of the connector pins 35, 35. Moreover, the holding substrate 34 is formed of the same raw substrate as the main substrate 30, and the permanent resists laminated on the main substrate 30 and the ink used for the silk pattern printing are made of the same material as the main substrate 30, so that the holding substrate 34 exhibits the same fire resistance as the main substrate 30. Therefore, if the fire resistance of the main substrate 30 clears a predetermined standard, the fire resistance of the holding substrate 34 also clears the predetermined standard. Incidentally, while the case where the connector fixing structure 33 is applied to the DVD integrated CRT television is discussed above in connection with the illustrated example, the connector fixing structure 33 may be applied to other electronic equipment. Moreover, the connector 32 may be a connector which is to be used for other applications. For example, the present invention may be applied to a connector for connecting a deflecting yoke. Of course, the number of the connector pins may be varied depending upon the type of the connector.

According to a further aspect of the present invention, there is provided the DVD integrated CRT television 1 having the main substrate 30 to which the connector 32 can be mounted. The DVD integrated CRT television 1 includes the sub-substrates 40, 50 which are formed with respect to the same work substrate 30a of high fire-resistant material of which the main substrate 30 is formed, and are separated from the main substrate 30 by cutting the work substrate 30a after forming of the substrates; the holding substrate 34 which is provided between the main substrate 30 and the sub-substrate 50 in the work substrate 30a, formed in the same manner as the main substrate 30 and the sub-substrate 50, separated from the main substrate 30 and the sub-substrate 50 by cutting the work substrate 30a after the forming of the substrates, and has the printed surface 34b including the indicator 34c which indicates the properties of the raw substrate formed by causing the holding substrate 34 as well as the main substrate 30 and the sub-substrate 50 to be subjected to the silk screen printing; the connector pins 35, 35 which comprises the substantially cylindrical standing-up portions 35a, 35a having the substantially fixed diameters, to which the connector 32 coupled to the degaussing coil 21 provided around the CRT 20 can be fitted on, the substantially cylindrical press-fitting portions having the substantially fixed diameters and the lengths larger than at least two times the thickness of the work substrate 30a, and the flange portions 35c, 35c provided between the standing-up portions 35a, 35a and the press-fitting portions 35b, 35b and having the diameters larger than those of the standing-up portions 35a, 35a and the press-fitting portions 35b, 35b; the substantially square-shaped pin holes 34a, 34a which are formed in the holding substrate 34 so as to have the intervals between the opposite sides thereof which are smaller than the diameters of the press-fitting portions 35b, 35b and so as to have the diagonal lengths larger than the diameters of the press-fitting portions 35b, 35b, and through which the press-fitting portions 35b, 35b are inserted from the side of the printed surface 34b until the flange portions 35c, 35c are abutted against the holding substrate 34; the through-holes 37, 37 which are formed in the main substrate 30 and through which the press-fitting portions 35b, 35b projecting from the holding substrate 34 are inserted so as to penetrate from the side of the component-mounted surface of the main substrate 30 to the side of the pattern surface of the main substrate in such a manner that the surface of the holding substrate 34 which is opposite to the printed surface 34b of the holding substrate 34 comes into close contact with the component-mounted surface of the main substrate 30; and the pads 38, 38 which are formed on the pattern surface of the main substrate 30 and can be soldered to the press-fitting portions 35b, 35b penetrating the pattern surface.

The connector fixing structure 33 of the present invention for fixing the connector 32 to the substrate 30, comprises the holding substrate 34 which is formed with respect to the same work substrate 30a of which the main substrate 30 is formed, and is separated from the main substrate 30 by cutting the work substrate 30a after forming of the substrates; the connector pins 35, 35 comprising the standing-up portions 35a, 35a on which the connector 32 can be fitted, and the press-fitting portions 35b, 35b having the lengths larger than at least two times the thickness of the work substrate 30a; the pin holes 34a, 34a which are formed in the holding substrate 34 and through which the press-fitting portions 35b, 35b penetrate; the through-holes 37, 37 which are formed in the substrate 30 and through which the press-fitting portions 35b, 35b projecting from the holding substrate 34 are inserted from the side of the component-mounted surface of the substrate 30 in such a manner that the holding substrate 34 comes into close contact with the component-mounted surface of the main substrate 30; and the pads 38, 38 which are formed on the surface of the main substrate 30 which is opposite to the component-mounted surface of the main substrate 30 and can be soldered to the press-fitting portions 35b, 35b penetrating the opposite surface.

According to the present invention, the holding substrate 34 is made by carrying out the forming of the substrates with respect to the same work substrate 30a, of which the substrate 30 is formed. The connector 32 is fixed to the substrate 30. Concretely, the substrate 30 and the holding substrate 34 are separated from each other by cutting the same work substrate 30a. Prior to the cutting of the work substrate 30a, both the substrate 30 and the holding substrate 34 are subjected to the respective substrate-forming processes which include the drilling, the formation of the copper patterns, the formation of the permanent resists, and the mounting of the components. The connector pins 35 comprise the standing-up portions 35a, 35a on which the connector 32 can be fitted, and the press-fitting portions 35b, 35b having the lengths larger than at least two times the thickness of the substrate 30. The holding substrate 34 is formed with the pin holes 34a, 34a through which the press-fitting portions 35b, 35b of the connector pins 35 can penetrate. The substrate 30 is formed with the through-holes 37, 37 through which the press-fitting portions 35b, 35b projecting from the holding substrate 34 are inserted from the side of the component-mounted surface of the substrate 30 in such a manner that the holding substrate 34 comes into close contact with the component-surfaced surface of the main substrate 30. Moreover, the pads 38, 38 are formed on the surface of the main substrate 30 which is opposite to the component-mounted surface of the substrate 30, and can be soldered to the press-fitting portions 35b, 35b penetrating the opposite surface of the substrate 30.

The press-fitting portions 35b, 35b have the lengths larger than at least two times the thickness of the substrate 30, so that the press-fitting portions 35b, 35b can penetrate both the holding substrate 34 and the main substrate 30 and project further than the main substrate 30. Therefore, the soldering between the projected press-fitting portions 35b, 35b and the pads 38, 38 can be carried out while dipping them into the solder bath. The pads 38, 38 and the press-fitting portions 35b, 35b are fixed to each other by the soldering and the press-fitting portions 35b, 35b penetrate both the main substrate 30 and the holding substrate 34, so that it is possible to realize the stable upright-standability of the connector pins 35, 35. Moreover, the holding substrate 34 can be produced in the same manner as the main substrate 30 is produced by the substrate-forming processes, so that it is possible to produce the holding substrate 34 at low cost. Furthermore, the holding substrate 34 has the same deformation properties as the substrate 30, so that it is possible to realize the holding substrate 34 having the same fire resistance as the main substrate 30, the holding substrate 34 and the main substrate 30 are not deformed differently from each other and the upright-standability of the connector pins is not deteriorated.

Moreover, according to the present invention, the pin holes 34a, 34a are formed so as to have the diameters slightly smaller than those of the press-fitting portions 35b, 35b.

In this case, the diameters of the pin holes 34a, 34a are smaller than those of the press-fitting portions 35b, 35b, so that when the press-fitting portions 35b, 35b are inserted through the pin holes 34a, 34a, the pin holes 34a, 34a are stretched out. At this time, elastic forces which resist such deformation of the pin holes 34a, 34a are produced, so that the elastic forces make it possible to securely fix the connector pins 35, 35 to the holding substrate 34.

Moreover, according to the present invention, the press-fitting portions 35b, 35b are each formed into the substantially cylindrical shape, and the pin holes 34a, 34a are each formed into the substantially rectangular-shape in such a manner that the interval between the opposite sides of each of the pin holes 34a, 34a is smaller than the diameter of each of the press-fitting portions 35b, 35b, and the diagonal length in each of the pin holes 34a, 34a is larger than the diameter of each of the press-fitting portions 35b, 35b.

In this case, the pin holes 34a, 34a are formed in such a manner that the length of the one side of each of the pin holes 34a, 34a is smaller than the diameter of each of the press-fitting portions 35b, 35b of the connector pins 35, 35 and the diagonal length in each of the pin holes 34a, 34a is larger than the diameter of each of the press-fitting portions 35b, 35b of the connector pins 35, 35. Therefore, when the press-fitting portions 35b, 35b are inserted through the pin holes 34a, 34a, the pin holes 34a, 34a are deformed in such a manner that the central regions of the respective sides of the pin holes 34a, 34a are stretched outward. Moreover, only the central regions of the respective sides of the pin holes 34a, 34a come into contact with the press-fitting portions 35b, 35b, and regions of the pin holes 34a, 34a which are adjacent the corners of the pin holes 34a, 34a do not come into contact with the press-fitting portions 35b, 35b. Therefore, it is possible to suitably adjust the resistance which is produced when the press-fitting portions 35b, 35b are inserted through the pin holes 34a, 34a, and the elastic forces which are generated between the connector pins 35, 35 and the holding substrate 34 and facilitate the fixing of the connector pins 35, 35 and the holding substrate 34. Moreover, the diagonal length in each of the pin holes 34a, 34a is larger than the diameter of each of the press-fitting portions 35b, 35b, thus facilitating the insertion of the press-fitting portions 35b, 35b through the pin holes 34a, 34a.

Moreover, according to the present invention, the holding substrate 34 has the printed surface 34b on which the indicator 34c indicating the properties of the raw substrate is formed by causing the holding substrate 34 together with the substrate 30 to be subjected to the silk screen printing, and the surface of the holding substrate 34 which is opposite to the printed surface 34b of the holding substrate 34 comes into close contact with the component-mounted surface of the substrate 30, when the press-fitting portions 35b, 35b projecting from the holding substrate 34 are inserted through the through-holes 37, 37.

In this case, the indicator 34c indicating the properties of the raw substrate is formed on the printed surface 34b of the holding substrate 34 by causing the holding substrate 34 together with the substrate 30 to be subjected to the silk screen printing. When the press-fitting portions 35b, 35b which are projected from the holding substrate 34 are inserted through the through-holes 37, 37, the surface of the holding substrate 34 which is opposite to the printed surface 34b of the holding substrate 34 comes into close contact with the component-mounted surface of the substrate 30, so that the printed surface 34b becomes exposed on the side of the component-mounted surface. This makes it possible to visually recognize the indicator 34c which indicates the properties of the raw substrate and is formed on the holding substrate 34. The indicator 34c which indicates the properties of the raw substrate may be, for example, an indicator indicating the fire-resistance grade of the raw substrate, or an indicator which indicates the name of the material of the raw substrate, to thereby indirectly indicate the properties of the raw substrate which include a fire-resistance grade and the like.

Moreover, according to the present invention, the raw substrate is made of fire-resistant material.

If the raw substrate is fire-resistant, the holding substrate 34 which is formed on the same raw substrate inevitably has the fire resistance.

Moreover, according to the present invention, the connector pins 35, 35 have the flange portions 35c, 35c which have each the diameter larger than that of each of the press-fitting portions 35b, 35b and are provided between the standing-up portions 35a, 35a and the press-fitting portions 35b, 35b, and the press-fitting portions 35b, 35b are inserted through the pin holes 34a, 34a until the flange portions 35c, 35c are abutted against the holding substrate 34 from the side of the printed surface 34b.

In this case, the flange portions 35c, 35c are abutted against the holding substrate 34 from the side of the printed surface 34b, so that the penetrating amount of the press-fitting portions 35c, 35c is restricted. That is, the flange portions 35c, 35c restrict the projecting amount of the press-fitting portions 35b, 35b, so that there are no possibilities that the projecting amount of the press-fitting portions 35b, 35b becomes uneven, the projecting amount of the standing-up portions 35a, 35a projecting from the opposite surface of the holding substrate 34 becomes uneven, and the fitting of the connector 32 is prevented.

Moreover, according to the present invention, the degaussing coil 21 which is provided around the CRT 20 is coupled to the connector 32.

In this case, the degaussing coil 21 which is provided around the CRT 20 can be securely connected to the substrate 30.

Moreover, according to the present invention, the substrate 30 is the main substrate 30 which is employed in the DVD integrated CRT television 1, and the holding substrate 34 is formed between the main substrate 30 and the sub-substrate 50 in the work substrate 30a in the same manner as the main substrate 30 and the sub-substrate 50 are formed.

In this case, the main substrate 30 and the sub-substrate 50 are produced by cutting the same work substrate 30a, and the holding substrate 34 is formed between the main substrate 30a and the sub-substrate 50 in the same work substrate 30a. That is, it is possible to usefully a wasteful region between the main substrate 30 and the sub-substrate 50 in the work substrate 30a.

Although the invention has been described in considerable detail in language specific to structural features and or method acts, it is to be understood that the invention defined in the appended claims is not necessarily limited to the specific features or acts described. Rather, the specific features and acts are disclosed as preferred forms of implementing the claimed invention. Therefore, while exemplary illustrative embodiments of the invention have been described, numerous variations and alternative embodiments will occur to those skilled in the art. Such variations and alternate embodiments are contemplated, and can be made without departing from the spirit and scope of the invention.

What is claimed is:

1. A DVD integrated CRT television having a main substrate to which a connector can be mounted, the DVD integrated CRT television comprising:

a sub-substrate formed with respect to a same work substrate of high fire-resistant material of which the main substrate is formed, the sub-substrate being separated from the main substrate by cutting the work substrate after forming of the substrates;

a holding substrate provided between the main substrate and the sub-substrate in the work substrate, and formed in the same manner as the main substrate and the sub-substrate, the holding substrate being separated from the main substrate and the sub-substrate by cutting the work substrate after the forming of the holding substrate and the main substrate, and the holding substrate having a printed surface including an indicator which indicates properties of a raw substrate formed by causing the holding substrate as well as the main substrate and the sub-substrate to be subjected to silk screen printing;

connector pins including substantially cylindrical standing-up portions having substantially fixed diameters to which the connector coupled to a degaussing coil provided around a CRT can be fitted on, substantially cylindrical press-fitting portions having substantially fixed diameters and the lengths larger than at least two times a thickness of the work substrate, and flange portions provided between the standing-up portions and the press-fitting portions and having diameters larger than those of the standing-up portions and the press-fitting portions;

substantially square-shaped pin holes formed in the holding substrate so as to have intervals between opposite sides thereof which are smaller than diameters of the press-fitting portions and so as to have diagonal lengths larger than the diameters of the press-fitting portions, the press-fitting portions being inserted through the substantially square-shaped pin holes from the side of the printed surface until the flange portions are abutted against the holding substrate;

through-holes formed in the main substrate, the press-fitting portions projecting from the holding substrate being inserted through the through-holes so as to penetrate from the side of a component-mounted surface of the main substrate to the side of a pattern surface of the main substrate in such a manner that the surface of the holding substrate which is opposite to the printed surface of the holding substrate comes into close contact with the component-mounted surface of the main substrate; and pads formed on the pattern surface of the main substrate and capable of being soldered to the press-fitting portions penetrating the pattern surface.

2. A connector fixing structure for fixing a connector to a substrate, the connector fixing structure comprising:

a holding substrate formed with respect to a same work substrate of which the substrate is formed, the holding substrate being separated from the substrate by cutting the work holding substrate and the substrate after forming of the substrates;

connector pins including standing-up portions on which the connector can be fitted, and press-fitting portions having lengths larger than at least two times a thickness of the work substrate;

pin holes formed in the holding substrate, the press-fitting portions penetrating the pin holes;

through-holes formed in the substrate, the press-fitting portions projecting from the holding substrate being inserted through the through-holes from the side of a component-mounted surface of the substrate in such a manner that the holding substrate comes into close contact with the component-mounted surface of the substrate; and pads formed on a surface of the substrate which is opposite to the component-mounted surface of the substrate, the pads being capable of being soldered to the press-fitting portions penetrating the opposite surface.

3. A connector fixing structure according to claim 2, wherein the pin holes are each made so as to have a hole size smaller than a diameter of each of the press-fitting portions.

4. A connector fixing structure according to claim 3, wherein the pin holes are each made so as to have an interval between opposite sides thereof which is smaller than the diameter of each of the press-fitting portions, and a diagonal length of a pin hole which is larger than the diameter of each of the press-fitting portions.

5. A connector fixing structure according to claim 2, wherein the holding substrate has a printed surface on which an indicator representing properties of the work substrate is formed by causing the holding substrate and the substrate to be subjected to silk screen printing; and a surface of the holding substrate which is opposite to the printed substrate comes into close contact with a component-mounted surface of the substrate when the press-fitting portions projecting from the holding substrate are inserted through the through-holes.

6. A connector fixing structure according to claim 2, wherein the substrate is made of material exhibiting fire resistance.

7. A connector fixing structure according to claim 2, wherein the connector pins have flange portions which are provided between the standing-up portions and the press-fitting portions and have diameters larger than those of the press-fitting portions, and the press-fitting portions are inserted through the pin holes until the flange portions are abutted against the holding substrate from the printed surface.

8. A connector fixing structure according to claim 2, wherein the connector is coupled to a degaussing coil which is provided around a CRT.

9. A connector fixing structure according to claim 2, wherein the substrate is a main substrate which is employed in a DVD integrated CRT television, and the holding substrate is formed between the main substrate and the sub-substrate in the work substrate in the same manner as the main substrate and the sub-substrate are formed.

* * * * *